United States Patent
Pan

(10) Patent No.: US 10,270,055 B2
(45) Date of Patent: Apr. 23, 2019

(54) FLEXIBLE DISPLAY DEVICE AND METHOD OF MANUFACTURING THE SAME

(71) Applicant: WUHAN CHINA STAR OPTOELECTRONICS TECHNOLOGY CO., LTD, Wuhan, Hubei (CN)

(72) Inventor: Biao Pan, Hubei (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 15/564,363

(22) PCT Filed: Jun. 22, 2017

(86) PCT No.: PCT/CN2017/089546
§ 371 (c)(1),
(2) Date: Oct. 4, 2017

(87) PCT Pub. No.: WO2018/166094
PCT Pub. Date: Sep. 20, 2018

(65) Prior Publication Data
US 2018/0269421 A1    Sep. 20, 2018

(30) Foreign Application Priority Data
Mar. 16, 2017   (CN) .......................... 2017 1 0156304

(51) Int. Cl.
*H01L 51/00*   (2006.01)
*H01L 51/52*   (2006.01)
(Continued)

(52) U.S. Cl.
CPC ...... *H01L 51/5215* (2013.01); *H01L 51/0097* (2013.01); *H01L 51/5024* (2013.01);
(Continued)

(58) Field of Classification Search
CPC ... H01L 51/00; H01L 51/009; H01L 51/0097; H01L 51/52; H01L 51/521;
(Continued)

(56) References Cited

U.S. PATENT DOCUMENTS

| | | | |
|---|---|---|---|
| 7,935,962 B2* | 5/2011 | Matsunami | C09K 11/06 257/103 |
| 2006/0251923 A1* | 11/2006 | Lin | C07F 15/0046 428/690 |
| 2014/0145171 A1 | 5/2014 | Park et al. | |

FOREIGN PATENT DOCUMENTS

| CN | 101263744 A | 9/2008 |
|---|---|---|
| CN | 103403912 A | 11/2013 |

(Continued)

*Primary Examiner* — Monica D Harrison
(74) *Attorney, Agent, or Firm* — Mintz Levin Cohn Ferris Glovsky and Popeo, P.C.; Kongsik Kim; Jhongwoo Jay Peck

(57) ABSTRACT

The present disclosure relates to a technical field of a display, especially a flexible display device including a substrate, an anode layer disposed on the substrate, and a hole injection layer, a hole transport layer, an organic light emitting layer, an electron transport layer, an electron injection layer, a cathode layer and a package layer disposed on the anode layer from bottom to top, wherein the anode layer includes a third metal layer disposed the substrate, and a first metal layer and a second metal layer disposed on the third metal layer by stacking up and down, the first metal layer and the third metal layer have work functions greater than that of the second metal layer, and the work functions of the first metal layer and/or the third metal layer are not less than 4.5 eV.

13 Claims, 3 Drawing Sheets

(51) Int. Cl.
*H01L 51/56* (2006.01)
*H01L 51/50* (2006.01)

(52) U.S. Cl.
CPC .......... *H01L 51/5218* (2013.01); *H01L 51/56* (2013.01); *H01L 51/5056* (2013.01); *H01L 51/5072* (2013.01); *H01L 51/5088* (2013.01); *H01L 2251/5338* (2013.01)

(58) Field of Classification Search
CPC ... H01L 51/5215; H01L 51/50; H01L 51/505; H01L 51/5056; H01L 51/507; H01L 51/5072; H01L 51/508; H01L 51/5088
USPC .......................................................... 257/40
See application file for complete search history.

(56) References Cited

FOREIGN PATENT DOCUMENTS

| | | |
|---|---|---|
| CN | 103427029 A | 12/2013 |
| CN | 105336869 A | 2/2016 |
| CN | 106848102 A | 6/2017 |

* cited by examiner

FLEXIBLE DISPLAY DEVICE AND METHOD OF MANUFACTURING THE SAME

CROSS-REFERENCES TO RELATED APPLICATIONS

This application is a U.S. national phase application, pursuant to 35 U.S.C. § 371, of PCT/CN2017/089546, filed Jun. 22, 2017, designating the United States, which claims priority to Chinese Application No. 201710156304.0, filed Mar. 16, 2017. The entire contents of the aforementioned patent applications are incorporated herein by this reference.

TECHNICAL FIELD

The present disclosure belongs to a technical field of a display, and particularly, relates to a novel flexible display device and a method of manufacturing the same.

BACKGROUND ART

An organic electroluminescent device is a novel flat panel display device, and compared with a liquid crystal display (LCD), has characteristics, such as high brightness, active luminescence, a wide view angle, a fast response speed, etc., which is a rising star in the field of a flat panel display, and shows wide development and application prospects. A light emitting principle of the organic electroluminescent device is that carriers are injected from electrodes into a light emitting layer by an external electric field to recombine so as to emit light. The organic electroluminescent device requires an anode material to have a high work function and a good light transmissivity to facilitate emission of the light from the device.

Currently, the anode material of the organic electroluminescent device generally adopts $In_2O_3$ doped with $SnO_2$ ($In_2O_3$:$SnO_2$), i.e., ITO. The ITO has a conduction band mainly composed by 5 s orbitals of In and Sn, and a valence band having an 2p orbital of oxygen occupying a dominant position, and oxygen vacancies and $Sn^{4+}$ ions replacing dopant atoms form a donor level and affect a carrier concentration in the conduction band. Since the oxygen vacancies and $Sn^{4+}$ ions replacing doped $In^{3+}$ ions, which are generated in an ITO thin film, form a highly degenerated n-type semiconductor during deposition of ITO, and an Fermi level EF is located above a bottom of the conduction band EC, ITO has a very high carrier concentration and a low resistivity. In addition, ITO has a relatively wide band gap, and thus the ITO thin film has a very high transmittance for visible light and near infrared light. Since ITO has the above excellent conductivity and light transmission, it is widely used as an anode electrode in an electro-optoelectronic device such as a liquid crystal display (LCD), an organic electroluminescent light emitting diode (OLED), a quantum dot light emitting diode (QLED) and a solar cell (OPV).

Although an ITO electrode has the above series of advantages, since ITO belongs to a non-stoichiometric compound, a chemical composition on a surface of the ITO thin film has a great influence on a work function of the surface thereof. The work function of ITO has a work function of 4.5-5.0 eV, which is still low compared with metals such as Ni (5.4 eV), and thus is not good for injection of holes. Meanwhile, since the ITO thin film is very flimsy, it is very easily to be damaged even subjecting to bending of a relatively small physical stress, and the ITO thin film has a poor flex resistance. However, the current deformable and flexible display device and the current flexible electroluminescent device have become the mainstream direction of the future market. Therefore, in the tide of the emerging product market where wearable equipments are gradually rising, the ITO material as a conductive electrode has been unable to meet the requirements of the market, and is gradually eliminated.

On this basis, it is necessary to provide a transparent conductive anode having a high work function and suitable for a flexible light emitting device to replace the ITO.

SUMMARY

In order to overcome the problem that ITO has a low work function and a poor flex resistance when being used as a material for a conductive electrode, the present disclosure provides a metal electrode which can replace ITO, and a flexible OLED device using the metal electrode as an anode layer.

The flexible display device includes a substrate, an anode layer disposed on the substrate, and a hole injection layer, a hole transport layer, an organic light emitting layer, an electron transport layer, an electron injection layer, a cathode layer and a package layer disposed on the anode layer from bottom to top, wherein the anode layer includes a third metal layer disposed the substrate, and a first metal layer and a second metal layer disposed on the third metal layer by stacking up and down, the first metal layer and the third metal layer have work functions greater than that of the second metal layer, and the work functions of the first metal layer and/or the third metal layer are not less than 4.5 eV.

Furthermore, a difference between the work function of the second metal layer and the work functions of the first metal layer and/or the third metal layer is 0.2-0.7 eV.

Furthermore, a sum of thicknesses of the first metal layer and the third metal layer is comparable to a total thickness of the second metal layer.

Furthermore, the first metal layer and/or the third metal layer have a thickness of 3-25 nm, and the second metal layer has a thickness of 6-50 nm.

Furthermore, a material for the first metal layer and/or the third metal layer is Ni, and a material for the second metal layer is Ag.

The present disclosure further provides a method of manufacturing the flexible display device, including: firstly forming a third metal layer on a substrate through a vacuum thermal evaporation method; then forming a second metal layer on the third metal layer through a coating process, and then drying and curing the second metal layer through a vacuum firing process and a hardening process; and finally forming a first metal layer on the second metal layer through the vacuum thermal evaporation method, wherein the first metal layer and the third metal layer have work functions greater than that of the second metal layer, and the work functions of the first metal layer and/or the third metal layer are not less than 4.5 eV; performing a surface impurity removing treatment on the first metal layer through a plasma process; forming a pattern of an anode layer of the flexible display device on the first metal layer sequentially through photolithography and curing processes and exposure and development processes; cleaning residual photoresist, and exposing and drying the anode layer; and sequentially forming a hole injection layer, a hole transport layer, an organic light emitting layer, an electron transport layer, an electron injection layer, a cathode layer and a package layer formed on the anode layer through the vacuum thermal evaporation method.

Furthermore, a difference between the work function of the second metal layer and the work functions of the first metal layer and/or the third metal layer is 0.2-0.7 eV.

Furthermore, an evaporation speed during the vacuum thermal evaporation method is controlled to be 0.9-1.1 Å/s.

Furthermore, a sum of thicknesses of the first metal layer and the third metal layer is comparable to a total thickness of the second metal layer.

Furthermore, the first metal layer and/or the third metal layer have a thickness of 3-25 nm, and the second metal layer has a thickness of 6-50 nm.

Furthermore, materials for the first metal layer and/or the third metal layer are Ni, and a material for the second metal layer is Ag.

The present disclosure applies a metal material with a relatively high work function to prepare an anode layer, meanwhile, a surface of the anode layer surface with a high work function is obtained after a surface treatment is performed on the metal material surface, which may further improve the work function of the anode layer, and improve hole injection efficiency.

On the other hand, since the a metal manufacturing process is realized by adopting the vacuum thermal evaporation method, the a preparation temperature is relatively low, which may reduce difficulty in the manufacturing process, and improve a yield of the anode layer, and moreover, since a bending property of a metal is better, the flexibility of the device may be improved, which is more suitable for a flexible light emitting device.

BRIEF DESCRIPTION OF THE DRAWINGS

The above and other aspects, characteristics and advantages of embodiments of the present disclosure will become more apparent, by the following descriptions taken in conjunction with the accompanying drawings, in which.

DETAILED DESCRIPTION OF EXEMPLARY EMBODIMENTS

Embodiments of the present disclosure will be described in detail below by referring to the accompany drawings. However, the present disclosure can be implemented in many different forms, and the present disclosure should not be construed to be limited hereto. Instead, these embodiments are provided for explaining the principle and actual application of the present disclosure, so that those skilled in the art would understand various embodiments and modifications which are suitable for specific intended applications of the present disclosure.

Figure 1:
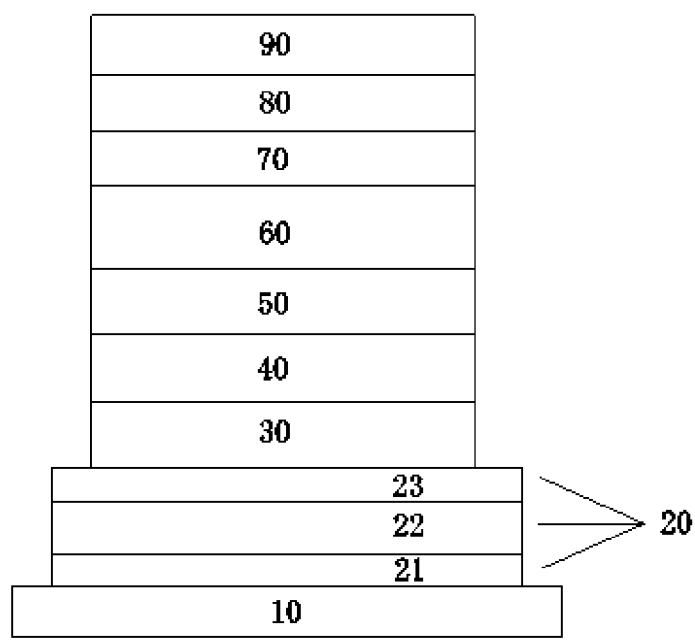
FIG. 1 is a structural schematic view of a flexible display device according to an embodiment of the present disclosure.

The present disclosure provides an improved structure of a flexible OLED device, and as shown in FIG. 1, the flexible display device includes a substrate 10, an anode layer 20, a hole injection layer 30, a hole transport layer 40, an organic light emitting layer 50, an electron transport layer 60, an electron injection layer 70, a cathode layer 80 and a package layer 90 in order from bottom to top.

A work function may be simply understood as an ability that an object owns or captures electrons. A work function of a metal is expressed as an electron of which an initial energy is equal to Fermi level, which is a minimum energy for an electron having an initial energy equal to an Fermi level required to escape from the inside of the metal into a vacuum atmosphere. The amplitude of the work function indicates a bound strength of electrons in the metal, and the greater the work function is, the more difficult for the electrons to escape from the metal gets. The numeric value of the work function is related to surface conditions, and as the atomic number progressively increases, the work function also presents periodic changes.

The anode layer 20 of the present disclosure adopts a transparent conductive anode having a high work function and suitable for a flexible light emitting device to replace the existing ITO electrode. Particularly, as shown in FIG. 1, the anode layer 20 includes a third metal layer 21, a second metal layer 22 and a first metal layer 23 disposed on the substrate 10 by sequentially stacking from bottom to top. The first metal layer and the third metal layer have work functions greater than that of the second metal layer, and a difference between the work function of the second metal layer and the work functions of the first metal layer and/or the third metal layer is 0.2-0.7 eV.

For example, metal material work functions of the third metal layer 21, the second metal layer 22 and the first metal layer 23 may be set to comprise metal materials having such work functions as high work function/low work function/high work function. That is, preferably, the work functions of the metal materials for the first metal layer and the third metal layer are greater than that of the second metal layer, moreover, the metal materials of the first metal layer and/or the third metal layer have work functions not less than 4.5 eV, and the metal material of the second metal layer has a work function less than 4.5 eV. However, the metal materials are generally selected to have a work function in a range of 4.5-5.5 eV, because the metal materials having high work functions are not good for the stability of the performance of the device due to excessive activity. The metal materials of the third metal layer 21 and the first metal layer 23 may be the same.

Particularly, the metal materials of the third metal layer 21, the second metal layer 22 and the first metal layer 23 may be selected as to be Ni (having a work function of 4.6 eV), Ag (having a work function of 4.2 eV), Ni (having a work function of 4.6 eV), and the anode layer thus obtained is Ni/Ag/Ni having a work function up to 5.4 eV.

Furthermore, a sum of thicknesses of the first metal layer and the third metal layer is preferably comparable to a total thickness of the second metal layer. Particularly, the first metal layer and/or the third metal layer has a thickness range of 3-25 nm, and the second metal layer has a thickness range of 6-50 nm.

Figure 2:
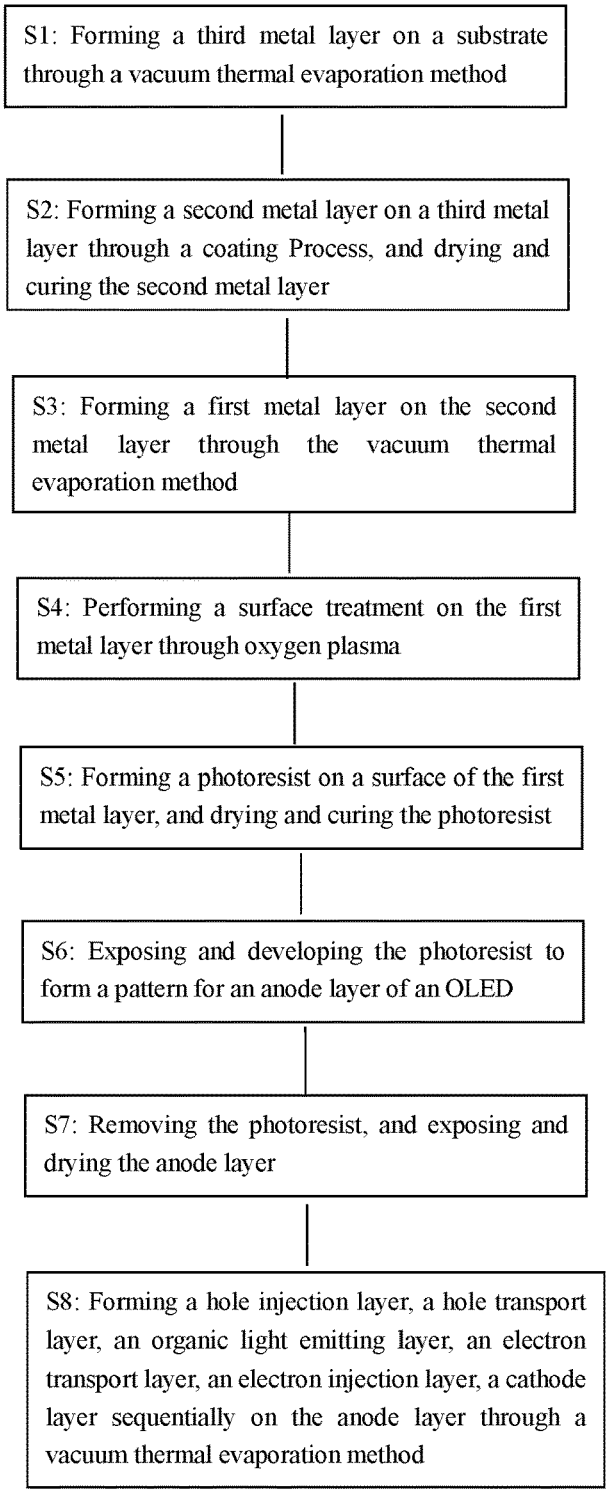
FIG. 2 is a flowchart of a flexible display device according to an embodiment of the present disclosure.

Methods for manufacturing such an anode layer and a flexible OLED comprising the same are described below in conjunction with FIG. 2, including following steps.

An anode layer is formed on a flexible substrate.

A flexible substrate is provided, of which a material may be any of polyethylene terephthalate (PET), polyamide (PI), polymethyl methacrylate (PMMA), etc.

S1: A Ni metal layer is evaporated with a thickness of 3 nm on the substrate by using a mask plate through using a vacuum thermal evaporation method in which an evaporation speed is controlled to be 0.9-1.1 Å/s, wherein during evaporating, it should keep a degree of vacuum at $10^{-5}$ Torr, and requires the temperature to keep the metal Ni in a gas state.

S2: A silver nanowire film is formed on the substrate through a coating process, and dried through a vacuum firing process (in particular, firing at a temperature of 60-80° C. for 60-90 seconds), and then cured through a hardening process (in particular, firing at a temperature of 150-170° C. for 10-18 minutes), thereby obtaining a second metal layer with a thickness of 6 nm.

S3: A first metal layer is finally formed with a thickness of 3 nm and from a material of Ni on the second metal layer by using the same method as that of the third metal layer.

A structure of "high work function/low work function/high work function" formed by alternatively stacking three layers of metal nano materials may be obtained through steps S1-S3, and in another embodiment, a metal nano layer structure with more than three layers may be formed by repeating steps S2 and S3 referring to such a way of alternatively stacking the metal materials with high and low work functions, and the purpose of the present disclosure may also be achieved.

S4: After forming the multilayer stacked metal nano layer structure, a surface treatment is performed on a Ni metal surface layer of the first metal layer through oxygen plasma. The plasma of oxygen has a high oxidization, which can oxidize impurities on the surface of the first metal layer, to achieve the purpose of cleaning the surface of the first metal layer.

S5: Then a photoresist is coated on the surface-treated first metal layer, and dried and cured. The particular operations are: placing the first metal layer coated with the photoresist in a vacuum oven, drying the photoresist by firing 60-80° C. for 60-90 seconds, and then curing the photoresist at a temperature of 150-170° C. for 10-18 minutes.

S6: The photoresist is exposed and then developed form a pattern of the anode layer of the flexible display device (OLED).

S7: Residual photoresist is cleaned to expose the anode layer, and the anode layer is dried through a dry process.

At this time, the preparation of the anode layer is completed.

S8: A hole injection layer, a hole transport layer, an organic light emitting layer, an electron transport layer, an electron injection layer, a metal cathode layer are sequentially formed on the anode layer through a vacuum thermal evaporation method.

In the present disclosure, for example, molybdenum trioxide is used as the hole transport layer, 4,4'-cyclohexylidenebis[N,N-bis(4-methylphenyl)aniline] (TAPC) is used as the hole transport layer, 4,4',4"-tris(carbazol-9-yl)triphenylamine (TCTA) is used as an exciton barrier layer, a host material N,N'-bis(N-carbazolyl)benzene (mCP) doped with bis(4,6-difluorophenylpyridinato-N,C2)picolinatoiridium (FIrpic) and bis(2-phenyl-benzothiazole-C2,N)(acetylacetonate)iridium(III) (Ir(bt)2(acac) is used as the organic light emitting layer, 1,3,5-tri(m-pyrid-3-yl-phenyl)benzene (TmPyPB) is used as the electron transport layer, LiF is used as the electron injection layer, and Al is used as the cathode layer.

The finally formed flexible display device has a structure as shown in FIG. 1, which may also be represented as follows:

PET/(Ni/Ag/Ni, 3 nm/6 nm/3 nm)/$MoO_3$ (5 nm)/TAPC (60 nm)/TCTA (5 nm)/mCP:FIrpic:Ir(bt)2(a cac)(7 wt %:1 wt %, 20 nm)/TmPyPB (35 nm)/LiF (1 nm)/Al (100 nm), the contents in "( )" after each function layer material indicating concentration or thickness value.

Figure 3:
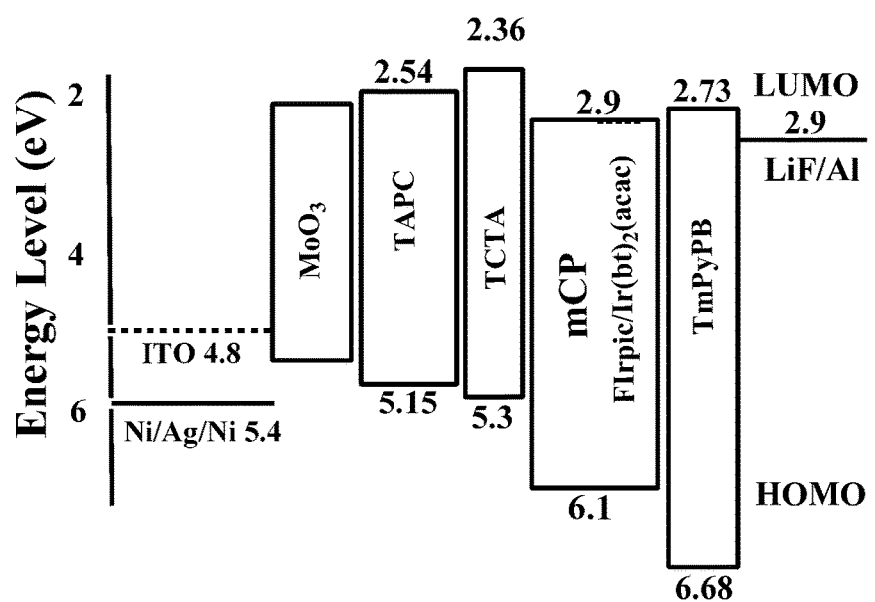
FIG. 3 is a schematic view of an energy level structure of respective material layers of a flexible display device according to an embodiment of the present disclosure.

The metal anode layer after being stacked by a plurality of layers of metal can have a work function up to 5.4 eV (after oxygen plasma treatment). The energy level structure of the flexible display device is shown in FIG. 3, LUMO is the unoccupied electronic orbital with the lowest energy level, and HOMO represents the occupied electronic orbital with the highest energy level, which is referred to as the highest occupied orbital; and it can be seen from FIG. 3 that the anode layer of the present disclosure has a relatively high work function, which may reduce a barrier between the anode layer and the hole transport layer, and improve injection effect of holes, and thus is very applicable to be used as the transparent electrode layer of the flexible display device.

Although the present disclosure has been described with reference to specific exemplary embodiments, those skilled in the art will understand that various changes in form and details may be made therein without departing from the spirit and scope of the disclosure as defined by the appended claims and its equivalents.

What is claimed is:

1. A flexible display device, comprising:
a substrate;
an anode layer disposed on the substrate; and
a hole injection layer, a hole transport layer, an organic light emitting layer, an electron transport layer, an electron injection layer, a cathode layer and a package layer disposed on the anode layer from bottom to top,
wherein the anode layer comprises:
a third metal layer disposed on the substrate;
a second metal layer disposed on the third metal layer; and
a first metal layer disposed on the second metal layer,
wherein the first metal layer and the third metal layer have work functions greater than that of the second metal layer, and the work functions of the first metal layer and/or the third metal layer are not less than 4.5 eV.

2. The flexible display device of claim 1, wherein a difference between the work function of the second metal layer and the work functions the first metal layer and/or the third metal layer is 0.2-0.7 eV.

3. The flexible display device of claim 2, wherein the first metal layer and/or the third metal layer have a thickness of 3-25 nm, and the second metal layer has a thickness of 6-50 nm.

4. The flexible display device of claim 2, wherein a material for the first metal layer and/or the third metal layer is Ni, and a material for the second metal layer is Ag.

5. A method of manufacturing a flexible display device, comprising steps of:
forming a third metal layer on a substrate through a vacuum thermal evaporation method;
forming a second metal layer on the third metal layer through a coating process, and drying and curing the second metal layer through a vacuum firing process and a hardening process;
forming a first metal layer on the second metal layer through the vacuum thermal evaporation method, wherein the first metal layer and the third metal layer have work functions greater than that of the second metal layer, and the work functions of the first metal layer and/or the third metal layer are not less than 4.5 eV;
performing a surface impurity removing treatment on the first metal layer through a plasma method;
forming a pattern of an anode layer of the flexible display device on the first metal layer sequentially through photolithography and curing processes and exposure and development processes;

cleaning residual photoresist, exposing and drying the anode layer; and forming a hole injection layer, a hole transport layer, an organic light emitting layer, an electron transport layer, an electron injection layer, a cathode layer and a package layer sequentially on the anode layer through the vacuum thermal evaporation method.

6. The method of claim 5, wherein a difference between the work function of the second metal layer and the work functions the first metal layer and/or the third metal layer is 0.2-0.7 eV.

7. The method of claim 6, wherein the first metal layer and/or the third metal layer have a thickness of 3-25 nm, and the second metal layer has a thickness of 6-50 nm.

8. The method of claim 6, wherein a material for the first metal layer and/or the third metal layer is Ni, and a material for the second metal layer is Ag.

9. The method of claim 5, wherein during the vacuum thermal evaporation, an evaporation speed is controlled to be 0.9-1.1 Å/s.

10. The method of claim 9, wherein the first metal layer and/or the third metal layer have a thickness of 3-25 nm, and the second metal layer has a thickness of 6-50 nm.

11. The method of claim 9, wherein a material for the first metal layer and/or the third metal layer is Ni, and a material for the second metal layer is Ag.

12. The method of claim 5, wherein the first metal layer and/or the third metal layer have a thickness of 3-25 nm, and the second metal layer has a thickness of 6-50 nm.

13. The method of claim 5, wherein a material for the first metal layer and/or the third metal layer is Ni, and a material for the second metal layer is Ag.

* * * * *